Feb. 7, 1967 M. D. RUBIN 3,303,078

METHOD OF MAKING ELECTRICAL COMPONENTS

Filed May 18, 1962 2 Sheets-Sheet 1

INVENTOR.

MILTON D. RUBIN

BY

Ezekiel Wolf, Wolf & Greenfield

ATTORNEYS

METHOD OF MAKING ELECTRICAL COMPONENTS

Filed May 18, 1962 2 Sheets-Sheet 2

INVENTOR.
MILTON D. RUBIN
BY
Ezekiel Wolf, Wolf & Greenfield
ATTORNEYS

United States Patent Office 3,303,078

Patented Feb. 7, 1967

3,303,078

METHOD OF MAKING ELECTRICAL COMPONENTS

Milton D. Rubin, Newton, Mass., assignor of thirty percent to David Wolf, Randolph, Mass.

Filed May 18, 1962, Ser. No. 195,827
6 Claims. (Cl. 156—150)

The present invention relates to a method of forming electrical components in a printed circuit network and to a network containing components formed in accordance with the method herein described.

There has been considerable difficulty in developing printed components for printed circuits. Consequently components for printed circuits are usually made in essentially the same manner as components used with nonprinted circuits. One principal difficulty in making printed components for printed circuits is the problem of making a printed component with precisely controlled parameters. In particular it is difficult to make a number of components on the same board essentially simultaneously, but of different values and with precise accuracy.

Some early attempts have been made to form printed circuits with integral printed components, particularly resistors. In such processes graphite or carbon powder has been sprinkled on the surface of a printed circuit board. A heated platen, often together with an adhesive material is then brought down upon the carbon material. Heat and pressure is applied for a period of time until the graphite or carbon powder is bonded to the board and the particles of carbon are bonded to each other. This process, however, offers very poor or inadequate control of the ohmic value of the resistor formed. Such process, even under reasonably controlled commercial conditions, might produce variations from the desired resistance by a factor of 10. Thus, a deposit which is made to produce a resistor of 100,000 ohms may be lower than 10,000 or higher than 1,000,000 ohms. This, of course, falls far outside the normally accepted range of deviations in resistors of a maximum 20%, and usually in commercial applications of 10%. In many applications less than 5% variations are desired.

Some attempts have been made to produce accurate resistors by using a resistance foil clad circuit board. However, these devices are extremely limited in utility because they require the use of a metal as a resistor. Unfortunately, no metal thick enough for foil cladding has high enough resistivity to be generally useful as a resistor.

Other attempts to provide printed circuit resistive components include a process which requires the machining or abrading of resistive material deposited on a printed circuit board until the resistor attains a desired value. However, under this process the resistor values must be continuously monitored during the process. While highly accurate resistors can be made in this fashion, it is relatively tedious, complicated and expensive procedure, which may be used only in a very limited fashion.

The present invention overcomes the foregoing problems and provides a method of forming printed circuit components integrally with the printed circuits and of accurately controlled values. The process is adapted for forming resistors as well as capacitors and other devices.

The process described provides a method by which the shape of the component is accurately controlled, together with the amount of material comprising the volume of the component. In this manner variations in the component parameters are greatly reduced and controlled.

An object of the present invention is to provide a method of forming printed circuit components integral with the printed circuit using a unique masking and depositing technique, wherein precisely controlled amounts of resistive material may be deposited and integrally bonded to a printed circuit over precisely controlled areas. Precise control of the amount of material deposited may be attained in a preferred form of the invention using an electrophoresis depository process. It is alternately contemplated that other methods such as a vacuum sputtering method may be used for depositing resistive material in a controlled fashion. With either electrophoresis or sputtering or electrolysis, the proportionality of the rate of deposition with the electric current provides a precise control of the amount of material deposited. However for some purposes it has been found that material can be deposited with sufficient precision by spraying, painting or dipping. Electrical control of spraying is possible by electrostatic control.

The present invention also contemplates a process wherein dielectric materials for forming capacitors are deposited under precisely controlled conditions, preferably utilizing a masking and electrophoresis process of the type herein described. Also contemplated, is a process of forming printed circuits having integrally formed magnetic materials for use in magnetic circuits and memories. Printed circuits with semiconductive materials for use in forming rectifiers and/or transistors are also contemplated by the present invention.

In the present invention there is provided a process in which a dielectric board is formed with one surface coated with a conductive material. A mask outlining the desired components is formed on the opposite surface to the conductive coating and resistive material is deposited by an electrophoresis, sputtering, spraying, painting or other deposition technique on the masked portions of the dielectric board. Since the dielectric board is preferably formed of a porous material such as fiberglass paper, the resistive material is impregnated in the unmasked areas through the porous dielectric board into intimate electrical contact with the conductive layer. If a nonporous dielectric board is used, slots may be cut through the dielectric board at the ends of the unmasked areas so that the deposited material intimately electrically contacts the conductive layer through these slots. The dielectric material may be eliminated in some cases and deposition made directly onto the conductive layer. After depositing the resistive material in the unmasked areas, the mask which may be a mechanical or photochemically produced mask, is removed by suitable means. The permeable dielectric layer is then impregnated with a resin, preferably a thermosetting resin, to saturation, and a sheet of resin impregnated paper or fabric material, preferably kraft paper, is laid over the deposited resistive material and impregnated dielectric layer. The laminate is then subjected to heat and pressure to set the thermosetting resin in the dielectric and paper layers and integrally bond the kraft paper to the dielectric material. The exposed surface of conductive material may then be treated by conventional techniques to form a suitable printed circuit with the various resistive elements formed in the unmasked areas comprising resistive components of the circuit.

While the previous steps describe a preferred method of bonding, the resistive, conducting and backing insulating elements by thermosetting means, in one step with heat and pressure, other methods of bonding may be used. Other methods include the use of epoxy cement resins and pressure. The sheet with these resistive elements may be adhered to any insulating base and the metal etched off afterwards away from the resistive material except where it is to make contact at the ends of the resistive material.

The resistive elements also may be deposited on copper foil which is then bonded to the insulating board as is conventionally done in making copper clad boards for etched printed circuits. The surface metal then is etched away over the resistive element.

These and other objects and advantages of the present invention will be more clearly understood when considered in connection with the accompanying drawings, in which:

FIGS. 1–10 inclusive illustrate sequential steps in forming of a novel printed circuit illustrated in FIG. 10;

In the method of the present invention a suitable dielectric layer or board 1 is formed with an adherent layer or coating of conductive metal on one side. The dielectric material 1 is preferably a porous inorganic, fibrous material such as fiberglass, rockwool or asbestos. This material is compacted into a cohesive mass and is coated with the conductive metal, preferably copper, in a uniform manner. If desired, the copper layer 3 may be adhered to the dielectric layer 1 by an intermediate evaporated film of silver, copper or the like, 2, in a manner described in United States Letters Patent No. 2,680,699, issued June 8, 1954, to M. D. Rubin, for "Method of Manufacturing a Conductive Coated Sheet and Said Sheet."

Figure 3:
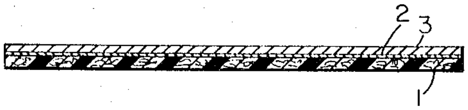
Figure 4:
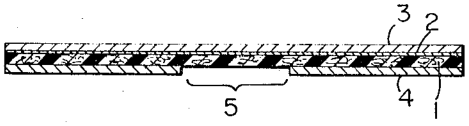
Figure 5:
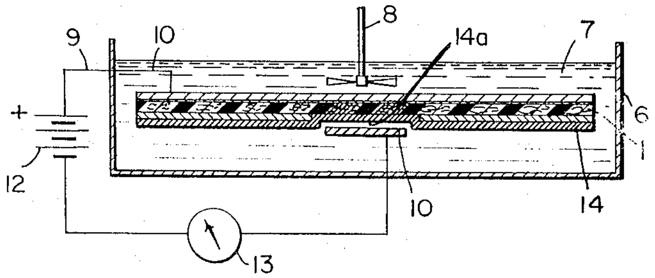

The lamination as illustrated in FIG. 3 is then treated to deposit a resistive material, preferably carbon or graphite, over a defined area 5 by one of several methods. The carbon or graphite may be sprayed on the area 5 by electrostatic attraction means, evaporation in a vacuum, or by a sputtering technique. However, it is most preferable to apply this material 14, from a liquid phase. By depositing the carbon or graphite from a colloidal suspension by electrophoresis, very precise control of the amount of material deposited may be attained. In the preferred process, the noncoated surface of the dielectric layer 1 is covered with a mask 4 having apertures defining an unmasked or exposed area 5 within which the carbon or graphite is to be deposited in intimate and integral contact with the dielectric layer 1. Any suitable mask may be utilized. However, it is preferable to use a physical mask formed of metal with a rubber surface intermediate the metal and the dielectric layer 1 so as to form a relatively tight liquid-impermeable seal. Other conventional types of masking systems may be used and include asphaltic masks or conventional photochemical masks. After the mask is applied as schematically illustrated in FIG. 4, the laminate with the attached mask is then introduced into a tank 6 containing a colloidal suspension of carbon or graphite particles in liquid phase, preferably water. The carbon particles should be finely divided and a suspension of between 3% and 5% carbon in water has been found suitable. An electrical circuit 9 having a series connection of a cathode 10, current control meter 13, battery 12, and anode 10 are connected to the circuit. The cathode 10 is positioned opposite the face of the exposed area of the dielectric material 1 and the anode 10 is connected to the conductive layer 3. A fixed direct current, preferably between 1 milliamp and 3 milliamps per sq. cm. is passed for a selected period of time, preferably from 2 minutes to four minutes, through the solution, causing the graphite to deposit over the exposed area 5 in a layer **14*a*. The material may be continuously agitated by a suitably driven agitator 8. The fibrous material is sufficiently porous to permit the graphite to impregnate through the dielectric material 1 into intimate electrical contact with the conductive layers 2 and 3 in an area substantially defined by the unmasked area 5, as illustrated in FIG. 5 at 14*a***. An accurately controlled amount of graphite may be deposited by controlling the time and current. The amount of material deposited is proportional to the current and time. While such deposition method is not as accurate as electrolytic deposition, it is sufficiently accurate for purposes of this invention. For example, current 2 ma. for 3 minutes over an exposed area of 1 sq. cm. from a suspension of 4% will deposit a layer of graphite of 3000 ohms resistance. After deposition the material is removed from the tank and dried.

Figure 6:
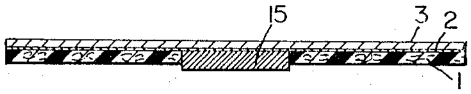

The mask is removed leaving a well defined area 15 of deposited carbon or graphite as illustrated in FIG. 6. In removing the mask the laminate should be cleaned with suitable solvents. Thus, if asphalt were used as a mask, it may be removed by placing the laminate in turpentine for a sufficient period of time to remove the asphalt. The laminate may thereafter be cleaned in alcohol and/or water. The copper surface may also be cleaned to remove any carbon or graphite which may have been deposited on the copper, by suitable means, as for example, etching or the like. As an alternative a mask may be applied to the metal surface 3 during the electrophoresis deposition.

Figure 7:
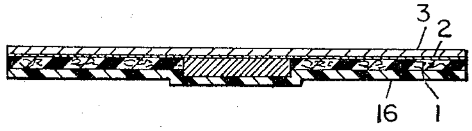
Figure 8:
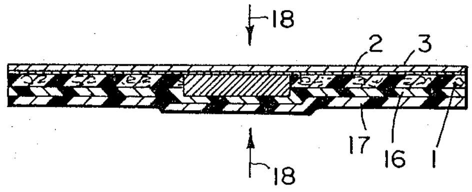

A thermosetting resin 16 is then applied to and largely impregnates fiberglass dielectric 1 as illustrated in FIG. 7. The process followed may be substantially the same as described in the forementioned patent. In this process, a thermosetting resin, preferably a phenolformaldehyde varnish is applied followed by a partially cured resin-impregnated kraft or similar paper sheet 17, as illustrated in FIG. 8. The process followed substantially as set forth in the aforementioned patent in which the thermosetting resin is only partially cured at first. The thermosetting resin 16 impregnates the dielectric sheet 1 and is partially cured prior to the application of the paper sheet 17. Heat and pressure is then applied as schematically indicated by arrows 18 to completely cure the laminate and compress it into a rigid unitary structure. Pressure should preferably be in the range of 800 lbs. to 1200 lbs. per square inch, with a temperature range approximately 300° F. to 350° F. for at least a few minutes or more. However, this will vary with the particular thermosetting resin used. The same cautions set forth in the aforementioned patent should be observed in this process.

Figure 9:
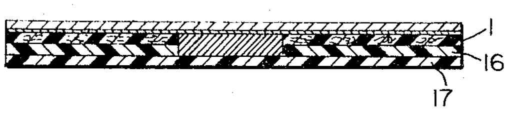
Figure 10:
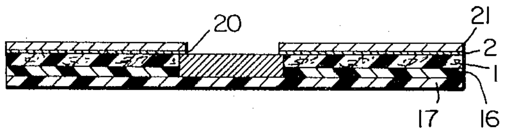
Figure 11:
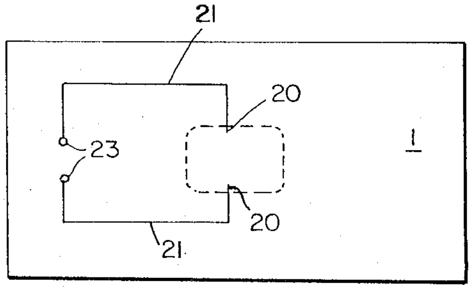
FIG. 11 is a top plan view in schematic form of a novel printed circuit made in accordance with the present invention.
Figure 12:
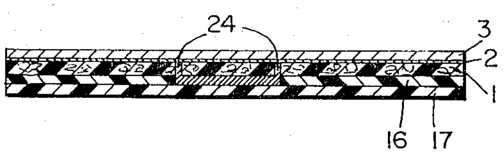
FIG. 12 is a schematic cross section illustrating a modification of the process of construction; and, FIG. 13 is a schematic cross section illustrating a modification showing a capacitor.

Following the application of layer 17 the product when fully cured appears substantially as illustrated in FIG. 9. After this, selected portions of the copper layer 3 and conductive layer 2 may be etched away by conventional means to form a circuit having leads such as illustrated at 21 in FIGS. 10 and 11. Since the resistive material permeated through the dielectric layer 1, it is in electric contact with the conductive layers 2 and 3 and thereby form conductive connections at 20 in the circuit 21. Suitable terminals 23 may be formed by conventional means.

The various thicknesses of the laminates may vary considerably depending upon the particular uses desired. However as an example of the invention, a laminate may be formed with a copper layer one mil thick, an evaporated film of copper 2, one micron thick, a fiberglass layer 1, between one and ten mils thick, a layer 16 of resin, ten mils thick normally is absorbed and impregnates the other layers and a kraft or paper or fiberglass backing sheet 17, thick enough to form a laminated composition approximately 1/16″ thick.

Capacitors can also be integrally deposited. Instead of depositing graphite 15 electrophoretically from a colloidal suspension, silica or other dielectric material is deposited electrophoretically from colloidal suspension in the same manner as described. A conducting surface of silver paint or other conducting material is then painted or coated over the dielectric material to form the other plate of the condenser. To form higher values of electrostatic capacity than can be achieved by a single layer of dielectric, multiple layers are needed, so that alternate layers of silica and evaporated or painted conductors may be deposited.

Figure 13:
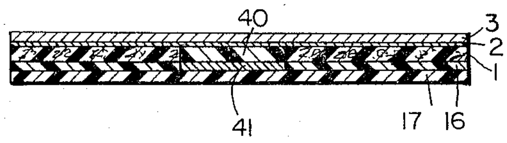

A device as formed is illustrated in FIG. 13. Here the layers 1, 2 and 3 may be formed as previously described. The dielectric deposit 40 may be of silica and may be electrophoretically deposited as described. A coating 41 of silver or like conductive material for the other plate of the capacitor may be deposited by painting or the like. A layer of thermosetting resin 16 and paper sheet 17 may be adhered to this modification as previously described. The layers 3 and 41 may then be used as parallel plates of a capacitor in a circuit by etching away unwanted portions of the plate 3 to form a circuit as previously described. Plate 41 may be connected to this circuit by cutting or etching or otherwise forming passages to the plate 41 through layers 1, 2 and 16, and thereafter connecting the plate 41 to the circuit by solder or equivalent means in the passages.

Resistors can be made of tin oxide, by depositing tin in the exact amount electrolytically, and then converting to the oxide chemically.

Circuits containing resistors and capacitors can be made into a module of layers. Each laminate of copper-fiberglass is treated individually to produce the resistive or capacitive elements as described. Then the layers are etched to remove the copper where not desired and the multiple layers are then bonded together with interspersed fiberglass sheets for insulation between layers.

One of the big advantages of electrical control of deposition is that a separate cathode can be used for each resistor. Thus a group of independent resistors can be deposited simultaneously from one bath. Widely controllable values of resistance can be obtained from the same bath by control of area of individual resistor current through its cathode, and time of deposition. The area is controlled by the mask. The total amount deposited is controlled by the current and the time. This last feature is not so easily attainable by non-electrical means. All resistors in a circuit can be accurately deposited in one operation without subsequent modification individually.

Figure 1:
Figure 2:

An alternate embodiment of this invention contemplates the formation of resistors and like components without the initial requirement of a metal back fibrous dielectric board. In this modification a dielectric board preferably of fiberglass such as illustrated in FIG. 1 is masked to outline the desired areas for deposit of resistive materials. This fiberglass layer is not coated with metal as illustrated in FIG. 2. After the fiberglass layer is masked graphite or other resistive material is deposited in a manner as previously described. The fiberglass layer is then coated with lines of conductive paint, preferably silver paint having the desired circuit configuration and contacting the graphite element. The layer is then dried and impregnated with a resin as previously described. These graphite impregnated fiberglass-paper assemblies may then be laminated with other fiberglass or paper laminates directly or with intermediate areas of silver paint connected components. The total lamination is dried and bonded. The impregnant may be epoxy instead of phenolic which minimizes the pressure required to form the bond.

I claim:

1. A method of forming printed circuits having components integrally formed therein,
   comprising forming a laminate of an impregnable porous dielectric layer and a conductive layer integrally bonded to one surface of said impregnable dielectric layer, masking selected portions of said dielectric layer on the surface opposite said conductive layer thereby forming unmasked areas conforming to the desired shape of said components,
   depositing in said areas a selected amount of restrictive material into intimate contact with said dielectric layer and allowing said resistive material to permeate said dielectric layer and electrically contact said conductive layer,
   removing said mask,
   impregnating said dielectric layer with a layer of plastic resin,
   and removing selected portions of said conductive layer to form a circuit with said resistive material in said areas included in said circuit and contacted by other unremoved selected portions of said conductive layer.

2. A method of forming electrical components in a board adapted for use in making printed circuits comprising,
   bonding a layer of an impregnable porous dielectric with a conductive layer on one surface thereof,
   depositing by electrophoresis on defined areas of said dielectric layer on the surface opposite said conductive layer a selected amount of resistive material in intimate contact with said dielectric layer and allowing said resistive material to permeate and electrically contact said conductive layer.

3. A method as set forth in claim 2 wherein said opposite surface of said dielectric layer and said resistive material is coated with a backing in a subsequent step.

4. A method as set forth in claim 3 wherein said backing is formed by coating said dielectric layer with a layer of plastic resin and thereafter applying and bonding a backing layer permeable to said plastic resin.

5. A method in accordance with the method of claim 2, wherein said resistive material is a form of carbon and is deposited from a liquid dispersion.

6. A method in accordance with the method of claim 2 wherein said carbon comprises a suspension of between approximately 3% to 5% finely divided graphite in water.

References Cited by the Examiner

UNITED STATES PATENTS

| | | | |
|---|---|---|---|
| 2,138,938 | 12/1938 | Plensler | 156—150 |
| 2,662,957 | 12/1953 | Eisler | 338—2 |
| 2,680,699 | 6/1954 | Rubin | 161—165 X |
| 2,884,571 | 4/1959 | Hannahs | 317—101 |
| 2,970,064 | 1/1961 | Bolton | 117—212 |
| 3,037,923 | 6/1962 | Gnau | 204—181 |
| 3,053,929 | 9/1962 | Friedman | 174—68.5 |
| 3,061,911 | 11/1962 | Baker | 338—307 |
| 3,094,477 | 6/1963 | Jackson et al. | 204—181 X |
| 3,115,423 | 12/1963 | Ashworth | 117—212 |
| 3,167,490 | 1/1965 | Friedman | 204—15 |
| 3,211,639 | 10/1965 | McNeill et al. | 204—181 X |

FOREIGN PATENTS

| | | |
|---|---|---|
| 728,219 | 4/1955 | Great Britain. |

EARL M. BERGERT, *Primary Examiner.*

R. C. CARLSON, J. P. MELOCHE, *Assistant Examiners.*